United States Patent
Moench et al.

(10) Patent No.: US 10,256,380 B2
(45) Date of Patent: Apr. 9, 2019

(54) METHOD OF PRODUCING AN OPTOELECTRONIC COMPONENT, AND OPTOELECTRONIC COMPONENT

(71) Applicant: OSRAM Opto Semiconductors GmbH, Regensburg (DE)

(72) Inventors: Wolfgang Moench, Pentling (DE); Frank Singer, Regenstauf (DE); Thomas Schwarz, Regensburg (DE); Jürgen Moosburger, Lappersdorf (DE); Stefan Illek, Donaustauf (DE)

(73) Assignee: OSRAM Opto Seiconductors GmbH (DE)

( * ) Notice: Subject to any disclaimer, the term of this patent is extended or adjusted under 35 U.S.C. 154(b) by 50 days.

(21) Appl. No.: 15/524,413

(22) PCT Filed: Nov. 5, 2015

(86) PCT No.: PCT/EP2015/075801
§ 371 (c)(1),
(2) Date: May 4, 2017

(87) PCT Pub. No.: WO2016/071439
PCT Pub. Date: May 12, 2016

(65) Prior Publication Data
US 2018/0287022 A1    Oct. 4, 2018

(30) Foreign Application Priority Data
Nov. 5, 2014   (DE) .................. 10 2014 116 134

(51) Int. Cl.
*H01L 33/58*   (2010.01)
*H01L 33/00*   (2010.01)
(Continued)

(52) U.S. Cl.
CPC .......... *H01L 33/58* (2013.01); *H01L 33/0095* (2013.01); *H01L 33/505* (2013.01);
(Continued)

(58) Field of Classification Search
CPC ......... H01L 33/52; H01L 33/54; H01L 33/56; H01L 33/505; H01L 33/507; H01L 33/005; H01L 33/58
See application file for complete search history.

(56) References Cited

U.S. PATENT DOCUMENTS

| 9,312,435 B2 | 4/2016 | Gaertner et al. |
| 2007/0009223 A1 | 1/2007 | Rudmann et al. |

(Continued)

FOREIGN PATENT DOCUMENTS

| CN | 103262267 A | 8/2013 |
| DE | 10 2004 053 116 A1 | 5/2006 |

(Continued)

OTHER PUBLICATIONS

Notice of Reasons for Rejection dated Mar. 6, 2018, of corresponding Japanese Application No. 2017-519666, along with an English translation.

(Continued)

*Primary Examiner* — Scott B Geyer
(74) *Attorney, Agent, or Firm* — DLA Piper LLP (US)

(57) ABSTRACT

A method of producing an optoelectronic component includes embedding an optoelectronic component part into a molded body such that an upper side of the optoelectronic component part is at least partially exposed on an upper side of the molded body; arranging and structuring a sacrificial layer above the upper side of the optoelectronic component part and the upper side of the molded body; arranging and structuring a layer of an optical material above the sacrificial layer; and removing the sacrificial layer.

14 Claims, 10 Drawing Sheets

(51) Int. Cl.
*H01L 33/56* (2010.01)
*H01L 33/50* (2010.01)
*H01L 33/62* (2010.01)
*H02N 1/00* (2006.01)

(52) U.S. Cl.
CPC .............. *H01L 33/56* (2013.01); *H01L 33/62* (2013.01); *H02N 1/006* (2013.01); *H01L 2933/0058* (2013.01)

(56) References Cited

U.S. PATENT DOCUMENTS

| | | | |
|---|---|---|---|
| 2009/0086449 A1* | 4/2009 | Minamio | H01L 27/14618 361/760 |
| 2009/0194776 A1 | 8/2009 | Pachler | |
| 2010/0176410 A1 | 7/2010 | Furuyama | |
| 2011/0186867 A1 | 8/2011 | Singer et al. | |
| 2012/0326170 A1* | 12/2012 | Liu | H01L 25/167 257/82 |
| 2013/0032820 A1 | 2/2013 | Wirth | |
| 2013/0200412 A1 | 8/2013 | Ramchen et al. | |
| 2013/0207145 A1 | 8/2013 | Schneider et al. | |
| 2013/0285084 A1 | 10/2013 | Schneider et al. | |
| 2014/0034983 A1 | 2/2014 | Gebuhr et al. | |
| 2014/0098540 A1 | 4/2014 | Krauss | |
| 2015/0243857 A1 | 8/2015 | Sabathil et al. | |
| 2015/0333232 A1 | 11/2015 | Preuβ et al. | |
| 2015/0380602 A1 | 12/2015 | Schwarz et al. | |
| 2016/0005936 A1 | 1/2016 | Illek et al. | |
| 2016/0013380 A1 | 1/2016 | Moosburger et al. | |
| 2017/0025581 A1 | 1/2017 | Weidner et al. | |

FOREIGN PATENT DOCUMENTS

| | | |
|---|---|---|
| DE | 10 2009 036 621 A1 | 2/2011 |
| DE | 10 2011 007 328 A1 | 10/2012 |
| DE | 10 2012 215 524 A1 | 3/2014 |
| DE | 10 2013 202 902 A1 | 8/2014 |
| DE | 10 2013 202 906 A1 | 8/2014 |
| DE | 10 2013 202 910 A1 | 9/2014 |
| JP | 2007-524243 | 8/2007 |
| JP | 2007-311423 | 11/2007 |
| JP | 2007-311423 A | 11/2007 |
| JP | 2010-157638 | 7/2010 |
| JP | 2010-165754 | 7/2010 |
| JP | 2011-9572 | 1/2011 |
| JP | 2011-505071 | 2/2011 |
| JP | 2013-526016 | 6/2013 |
| JP | 2013-534733 | 9/2013 |
| JP | 2013-535111 | 9/2013 |
| JP | 2013-541208 | 11/2013 |
| JP | 2014-506015 | 3/2014 |
| WO | 2009/075530 | 6/2009 |
| WO | 2014/095923 | 6/2014 |

OTHER PUBLICATIONS

First Office Action dated Jun. 26, 2018, of counterpart Chinese Application No. 201580060308.8, along with an English translation.

* cited by examiner

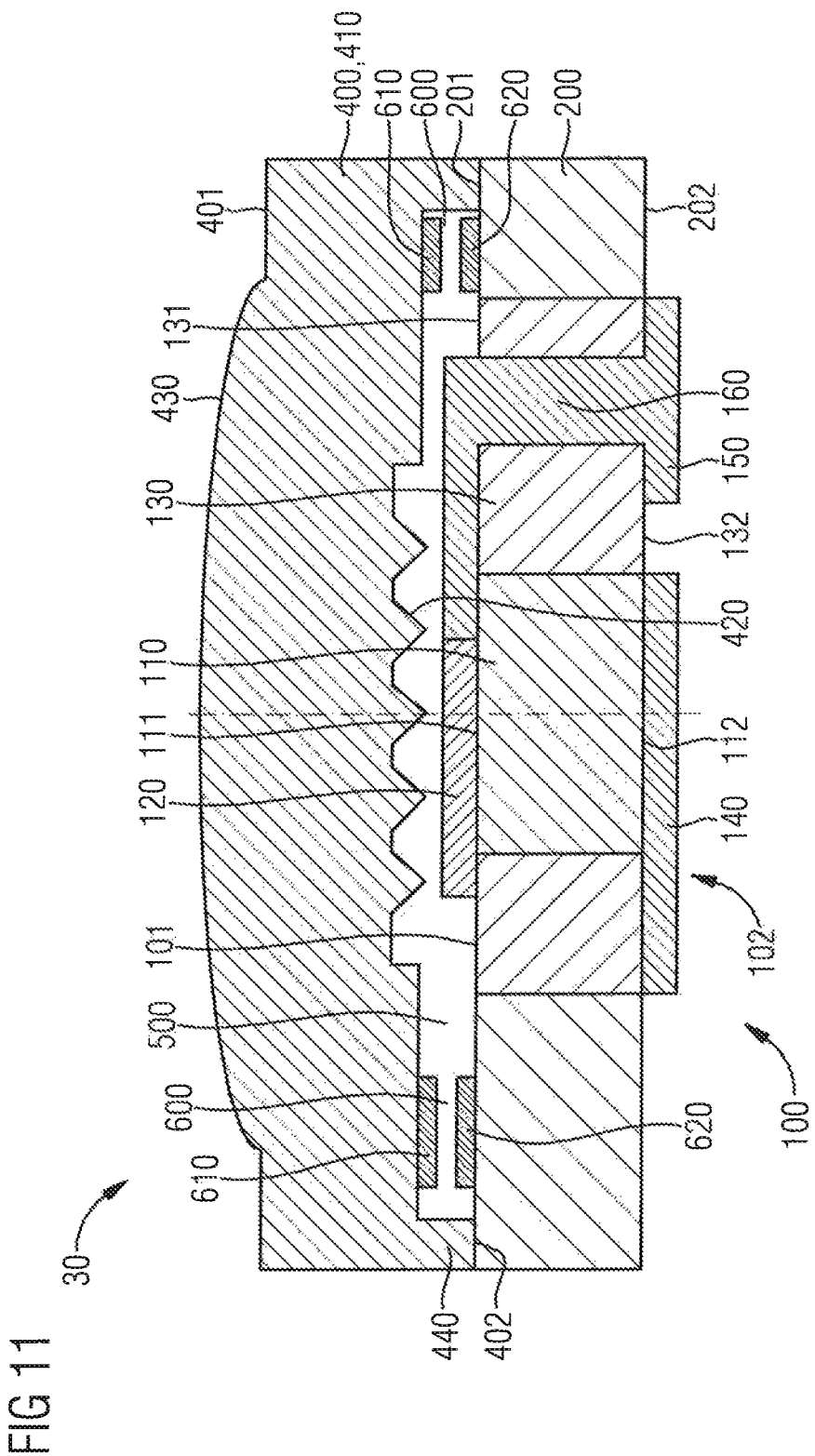

METHOD OF PRODUCING AN OPTOELECTRONIC COMPONENT, AND OPTOELECTRONIC COMPONENT

TECHNICAL FIELD

This disclosure relates to a method of producing an optoelectronic component and an optoelectronic component.

BACKGROUND

It is known to equip optoelectronic components, for example, light-emitting diode components with optical lenses which produce beam shaping of electromagnetic radiation radiated by the optoelectronic component.

SUMMARY

We provide a method of producing an optoelectronic component including embedding an optoelectronic component part into a molded body such that an upper side of the optoelectronic component part is at least partially exposed on an upper side of the molded body; arranging and structuring a sacrificial layer above the upper side of the optoelectronic component part and the upper side of the molded body; arranging and structuring a layer of an optical material above the sacrificial layer; and removing the sacrificial layer.

We also provide an optoelectronic component including an optoelectronic semiconductor chip embedded into a molded body, wherein an upper side of the optoelectronic semiconductor chip is at least partially not covered by the molded body, an optical lens is arranged above the upper side of the optoelectronic semiconductor chip, the optical lens connects to the molded body, an air gap is arranged between the upper side of the optoelectronic semiconductor chip and the optical lens, the molded body includes a first partial molded body and a second partial molded body, the optoelectronic semiconductor chip is embedded into the first partial molded body, and the first partial molded body is embedded into the second partial molded body.

BRIEF DESCRIPTION OF THE DRAWINGS

FIG. 11 schematically shows a cut-away side view of an optoelectronic component according to a third example.

LIST OF REFERENCE NUMERALS

Figure 1:
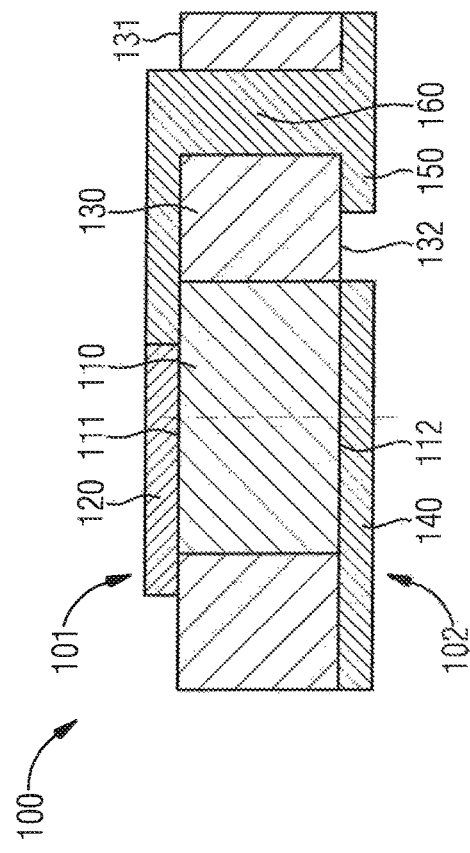
FIG. 1 schematically shows a cut-away side view of an optoelectronic component part.

10 Optoelectronic component
20 Optoelectronic component
30 Optoelectronic component
100 Optoelectronic component part
101 Upper side
102 Lower side
110 Optoelectronic semiconductor chip
111 Upper side
112 Lower side
120 Converter element
130 First molded body
131 Upper side
132 Lower side
140 First electrical contact
150 Second electrical contact
160 Via
200 Second molded body
201 Upper side
202 Lower side
300 Sacrificial layer
301 Upper side
302 Lower side
310 Structuring
320 Placeholder
400 Layer of an optical material
401 Upper side
402 Lower side
410 Optical lens
420 Lower-side structuring
430 Upper-side structuring
440 Anchor
450 Channel
500 Air gap
600 Actuator
610 Lens-side electrode
620 Molded body-side electrode

DETAILED DESCRIPTION

Our method of producing an optoelectronic component includes steps of embedding an optoelectronic component part into a molded body such that an upper side of the optoelectronic component part is at least partially exposed on an upper side of the molded body, arranging and structuring a sacrificial layer above the upper side of the optoelectronic component part and the upper side of the molded body, applying and structuring a layer of an optical material above the sacrificial layer, and removing the sacrificial layer.

In this method, an optical element, for example, an optical lens, may be formed from the layer of the optical material. The shape and the imaging property of the optical element formed from the layer of the optical material may also advantageously be designed in a highly variable manner.

By the sacrificial layer initially arranged between the upper side of the optoelectronic component and the layer of the optical material, and which is removed in a subsequent method step, in the optoelectronic component obtainable via the method, an air gap is configured between the upper side of the optoelectronic component part and a lower side of the optical element formed from the layer of the optical material. An etendue thereby results which is smaller than would be if there were direct contact between the upper side of the optoelectronic component part and the optical lens. This results in advantages for applications of the optoelectronic component obtainable via the method in which a collimation of emitted light is important, for example, for applications such as projection, stage lighting, and front headlights of a motor vehicle.

An additional advantage of the method is that both the lower side of the optical element facing the optoelectronic component part formed from the layer of the optical material, and the upper side of this optical element facing away from the optoelectronic component part, are useful as optically refractive interfaces and may be provided with a structuring. As a result, both surfaces of the optical element may be used for beam deflection of electromagnetic radiation emitted by the optoelectronic component part of the optoelectronic component obtainable via the method.

The optoelectronic component part may comprise an optoelectronic semiconductor chip, in particular a light-emitting diode chip. As a result, the optoelectronic component part is configured to emit electromagnetic radiation, for example, visible light.

The optoelectronic component part may be embedded into the molded body such that a lower side of the optoelectronic component part is at least partially exposed on a lower side of the molded body. As a result, in the optoelectronic component obtainable via the method, the lower side of the optoelectronic component part remains advantageously accessible.

The optoelectronic component part may have electrical contacts on its lower side. In the optoelectronic component obtainable via the method, these electrical contacts advantageously remain accessible and may as a result form electrical contacts of the optoelectronic component obtainable via the method.

Embedding the optoelectronic component part into the molded body may be carried out such that the upper side and the lower side of the optoelectronic component part are flush with the upper side and the lower side of the molded body. In this case, embedding the optoelectronic component part into the molded body may, for example, be carried out via film-assisted transfer molding. As a result, additional processing of the optoelectronic component is advantageously simplified. In addition, an optoelectronic component having particularly compact outer dimensions thereby advantageously results.

The molded body may be formed by a molding method. In this case, the optoelectronic component part is embedded into the molded body during formation of the molded body. The molding method may, for example, be compression molding or transfer molding. As a result, the method may advantageously be carried out in a particularly simple, rapid, and economical manner. In addition, the method is advantageously suitable for mass processing as a composite panel structure or wafer structure.

The sacrificial layer may comprise a photoresist. As a result, simple application, simple processing, and simple removal of the sacrificial layer are advantageously made possible. In this case, established methods of semiconductor technology may advantageously be utilized.

Structuring the sacrificial layer may be carried out via a photolithographic method, in particular via mask, contact, grayscale, or laser-interference lithography, via direct illumination, or via an imprinting method. As a result, a simple and precise structuring of the sacrificial layer is advantageously made possible. Advantageously, the method may be adapted to the desired structuring of the sacrificial layer. In this case, it is advantageously possible to use established methods of semiconductor technology.

Removal of the sacrificial layer may be carried out by dissolving the sacrificial layer. As a result, simple, rapid removal of the sacrificial layer, which is gentle on the optoelectronic component obtainable via the method, is advantageously made possible.

Dissolving the sacrificial layer may be carried out by a solvent or an etching solution. As a result, simple, rapid, economical, and reliable removal of the sacrificial layer is advantageously made possible.

The optical material may comprise a plastic. Advantageously, the optical material may include a silicone or a polycarbonate. As a result, the optical material may be obtained economically and may be processed using established methods.

Structuring the optical material may be carried out via a photolithographic method or via an imprinting method. This advantageously enables a flexible structuring of the optical material. In this case as well, it is advantageously possible to use established methods.

Multiple optoelectronic component parts may be embedded together into the molded body. In this case, a section of the sacrificial layer is arranged and structured above each optoelectronic component part. Subsequently, a section of the optical material is arranged and structured above each section of the sacrificial layer. Finally, the optoelectronic component is singulated by dicing the molded body. As a result, the method advantageously enables production of a plurality of optoelectronic components in common processing steps. As a result, the production costs per individual optoelectronic component may advantageously be significantly reduced.

Dicing the molded body may be carried out before removal of the sacrificial layer or after removal of the sacrificial layer. It is also possible to initially dice the molded body partially, for example, in columns or in rows, then to dissolve the sacrificial layer, and subsequently completely dice the molded body. In this case, during the first partial dicing of the molded body, accesses to the sacrificial layer may advantageously be formed, which enable or facilitate the removal of the layer.

An optoelectronic component comprises an optoelectronic semiconductor chip having an upper side. The optoelectronic semiconductor chip is embedded into a molded body. In this case, the upper side of the optoelectronic semiconductor chip is at least partially not covered by the molded body. An optical lens is arranged above the upper side of the optoelectronic semiconductor chip. The optical lens connects to the molded body. An air gap is arranged between the upper side of the optoelectronic semiconductor chip and the optical lens.

The optical lens of this optoelectronic component enables beam shaping of electromagnetic radiation emitted by the optoelectronic semiconductor chip of the optoelectronic component. Due to the air gap configured between the upper side of the optoelectronic semiconductor chip and the optical lens, an etendue is advantageously made possible which is smaller than would be if there were direct contact between the optical lens and the upper side of the optoelectronic semiconductor chip. Due to the air gap configured between the upper side of the optoelectronic semiconductor chip and the optical lens, both a lower side of the optical lens facing the optoelectronic semiconductor chip and an upper side of the optical lens facing away from the optoelectronic semiconductor chip may be used for beam deflection and may be provided with a structuring.

A lower side of the optical lens facing the upper side of the optoelectronic semiconductor chip may have a structuring. As a result, the lower side of the optical lens may also be used for beam deflection and beam shaping of electromagnetic radiation emitted by the optoelectronic semiconductor chip of the optoelectronic component.

The molded body comprises a first partial molded body and a second partial molded body. In this case, the optoelectronic semiconductor chip is embedded into the first partial molded body. The first partial molded body is embedded into the second partial molded body. Production of the first partial molded body and the production of the second partial molded body may advantageously take place in separate processing steps. In this case, economical mass processing as a composite panel structure or wafer structure is advantageously possible in each processing step.

The optoelectronic component may comprise a microsystems technology actuator configured to move the optical lens relative to the molded body. The microsystems technology actuator may, for example, be configured as an electrostatic actuator. The actuator may make it possible to move the optical lens in a direction parallel to the upper side of the molded body and/or in a direction perpendicular to the upper side of the molded body. As a result, the actuator of the optoelectronic component advantageously makes it possible to change the imaging properties of the optical lens of the optoelectronic component.

The above-described properties, features and advantages and the manner in which they are achieved will be explained more clearly and comprehensively in conjunction with the following description of the examples, which are explained in greater detail in conjunction with the drawings.

FIG. 1 shows a schematic cut-away side view of an optoelectronic component part 100. The optoelectronic component part 100 comprises an optoelectronic semiconductor chip 110 configured to emit electromagnetic radiation, for example, to emit visible light. The optoelectronic semiconductor chip 110 may, for example, be a light-emitting diode chip (LED chip). In the example depicted in FIG. 1, the optoelectronic component part 100 is configured as a chip-in-a-frame component part. However, it is also possible to design the optoelectronic component part 100 as another component part having compact outer dimensions.

The optoelectronic semiconductor chip 110 has an upper side 111 and a lower side 112 opposite the upper side 111. The upper side 111 of the optoelectronic semiconductor chip 110 forms a radiation emission surface of the optoelectronic semiconductor chip 110. The optoelectronic semiconductor chip 110 is configured to radiate electromagnetic radiation, for example, visible light, on its upper side 111.

A converter element 120 is arranged on the upper side 111 of the optoelectronic semiconductor chip 110 provided to convert at least a portion of the electromagnetic radiation radiated by the optoelectronic semiconductor chip 110 on its upper side 111 into electromagnetic radiation of a different wavelength. The converter element 120 may, for example, be configured to convert electromagnetic radiation emitted by the optoelectronic semiconductor chip 110 having a wavelength from the blue or ultraviolet spectral range into electromagnetic radiation having a wavelength from the yellow spectral range. A mixture of unconverted and converted electromagnetic radiation may, for example, exhibit a white color effect. However, the converter element 120 may also be omitted.

In the depicted example, the optoelectronic semiconductor chip 110 has an electrical contact pad on its upper side 111 and one on its lower side 112, via which an electric current may be conducted through the optoelectronic semiconductor chip 110.

The optoelectronic semiconductor chip 110 of the optoelectronic component part 100 is embedded into a first molded body 130. In this case, the upper side 111 and the lower side 112 of the optoelectronic semiconductor chip 110 are at least partially not covered by the material of the first molded body 130, but are exposed. Preferably, the upper side 111 and the lower side 112 of the optoelectronic semiconductor chip 110 are, respectively, essentially flush with an upper side 131 of the first molded body 130 and a lower side 132 which is opposite the upper side 131. The upper side 111 of the optoelectronic semiconductor chip 110 and the upper side 131 of the first molded body 130 together form an upper side 101 of the optoelectronic component part. The lower side 112 of the optoelectronic semiconductor chip 110 and the lower side 132 of the first molded body 130 together form a lower side 102 of the optoelectronic component part 100.

The first molded body 130 comprises an electrically insulating material, preferably a plastic material. For example, the first molded body 130 may include an epoxy resin. The first molded body 130 may be produced via a shaping method (molding method), for example, via compression molding or via transfer molding. In particular, the first molded body 130 may, for example, be formed via film-assisted transfer molding. The optoelectronic semiconductor chip 110 is preferably already embedded into the molded body 130 during the formation of the first molded body 130 in that the optoelectronic semiconductor chip 110 is overmolded with the material of the first molded body 130.

A first electrical contact 140 and a second electrical contact 150 are arranged on the lower side 102 of the optoelectronic component part 100. The electrical contacts 140, 150 may, for example, be configured as planar metalizations. The first electric contact 140 extends across the lower side 112 of the optoelectronic semiconductor chip 110 and electrically conductively connects to the electrical contact surface of the optoelectronic semiconductor chip 110 arranged on the lower side 112 of the optoelectronic semiconductor chip 110. The second electrical contact 150 electrically conductively connects to the electrical contact surface of the optoelectronic semiconductor chip 110 arranged on the upper side 111 of the optoelectronic semiconductor chip 110 by a via 160 extending from the lower side 132 to the upper side 131 through the first molded body 130, and by a planar metalization arranged on the upper side 101 of the optoelectronic component part 100. The first electrical contact 140 and the second electrical contact 150 thus allow supplying the optoelectronic semiconductor chip 110 of the optoelectronic component part 100 with voltage and electric current.

The optoelectronic component part 100 may be produced together with a plurality of other optoelectronic component parts 100 in common processing steps. For this purpose, multiple optoelectronic semiconductor chips 110 are embedded together into the first molded body 130, in an arrangement spaced apart from one another. Subsequently, one via 160 is created in the first molded body 130 per optoelectronic semiconductor chip 110. In addition, the metalizations forming the electrical contacts 140, 150 and the electrically conductive connections are created on the upper side and the lower side of the first molded body 130, per optoelectronic semiconductor chip 110. The first molded body 130 is then diced to singulate the optoelectronic component parts 100.

Figure 2:
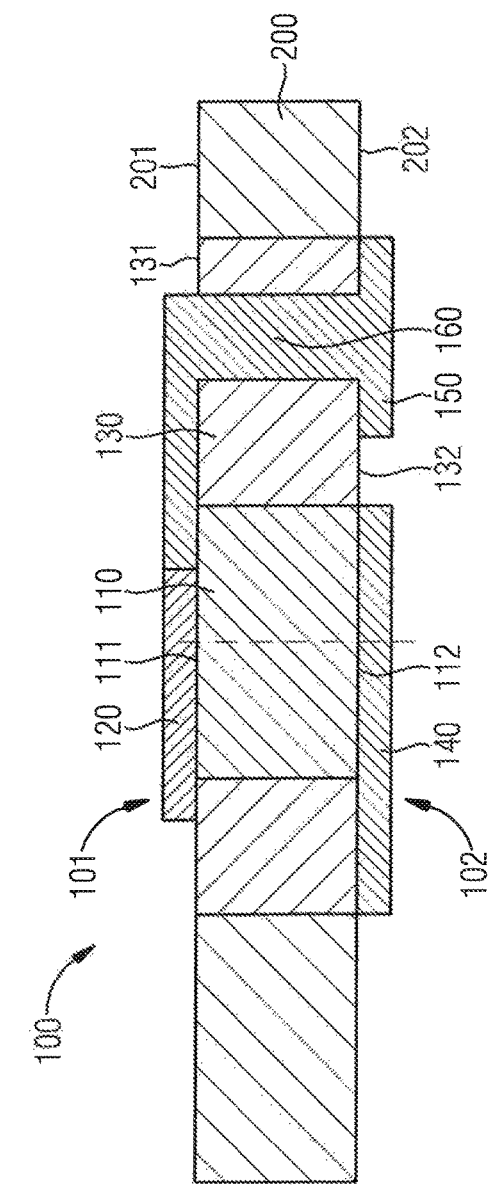
FIG. 2 schematically shows a cut-away side view of the optoelectronic component part after being embedded into a molded body.

FIG. 2 shows a schematic cut-away side view of the optoelectronic component part 100 in a processing state that chronologically follows the depiction of FIG. 1. The optoelectronic component part 100 has been embedded into a second molded body 200. The upper side 101 of the optoelectronic component part 100 and the lower side 102 of the optoelectronic component part 100 are at least partially not covered by the material of the second molded body 200 and are thus at least partially exposed. Preferably, the upper side 101 of the optoelectronic component part 100 is essentially flush with an upper side 201 of the second molded body 200. Likewise, the lower side 102 of the optoelectronic component part 100 is preferably essentially flush with a lower side 202 of the second molded body 200.

The second molded body 200 comprises an electrically insulating material, preferably a plastic material. The second molded body 200 may include the same material as the first molded body 130. However, the second molded body 200 may also include a material different from that of the first molded body 130.

Embedding the optoelectronic component part 100 into the second molded body 200 may in turn take place via a shaping method (molding method), wherein the optoelectronic component part 100 is overmolded with the material of the second molded body 200. In particular, the embedding of the optoelectronic component part 100 into the second molded body 200 may take place via film-assisted transfer molding.

Instead of initially embedding the optoelectronic semiconductor chip 110, as described, into the first molded body 130 to form the optoelectronic component part 100, and subsequently embedding the optoelectronic component part 100 into the second molded body 200, the optoelectronic semiconductor chip 110 may be directly embedded into the second molded body 200. The first molded body 130 is omitted in this case. In this case, the optoelectronic component part 100 is formed by the bare optoelectronic semiconductor chip 110 without the first molded body 130. Creation of the electrical contacts 140, 150 is carried out in this case on the lower side 202 of the second molded body 200, after the embedding of the optoelectronic semiconductor chip 110 into the second molded body 200. For this purpose, a via may be created in the second molded body 200.

Figure 3:
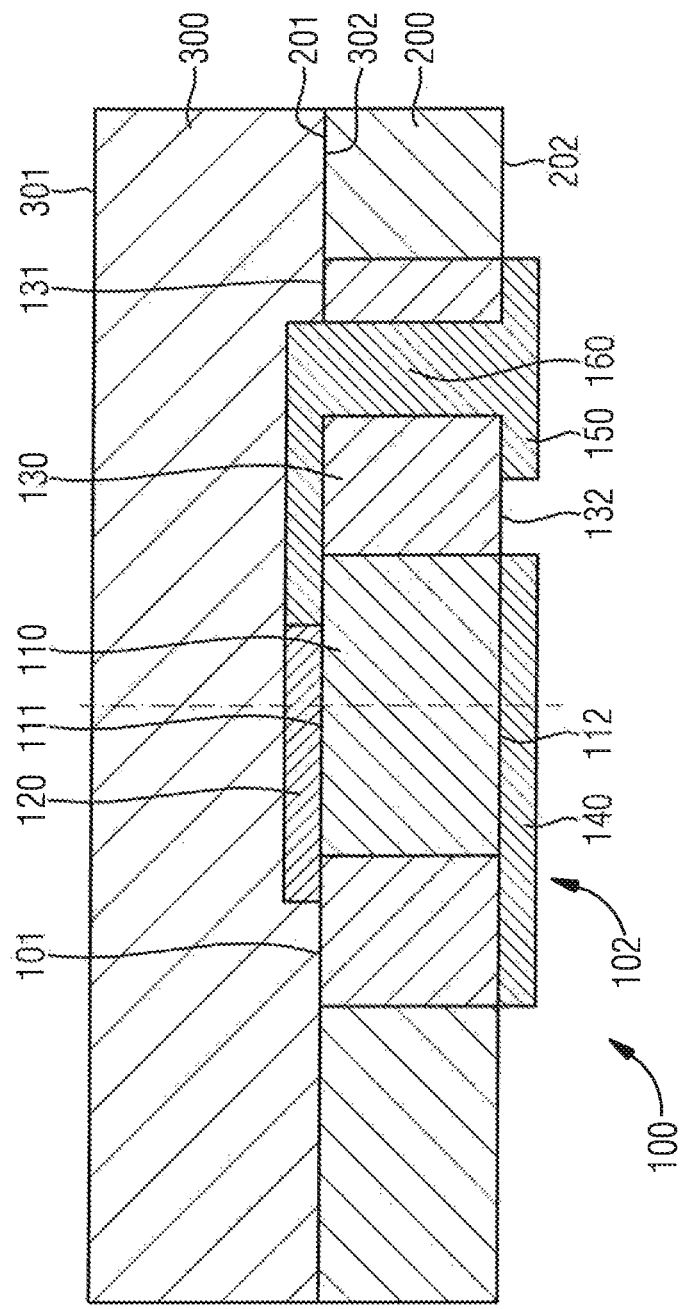
FIG. 3 schematically shows a cut-away side view of the molded body and a sacrificial layer arranged on it.

FIG. 3 shows a schematic cut-away side view of the second molded body 300 and the optoelectronic component part 100 embedded therein in a processing state that chronologically follows the depiction of FIG. 2. A sacrificial layer 300 has been arranged above the upper side 101 of the optoelectronic component part 100 and the upper side 201 of the second molded body 200. The sacrificial layer 300 has an upper side 301 and a lower side 302 opposite the upper side 301. The lower side 302 of the sacrificial layer 300 contacts the upper side 101 of the optoelectronic component part 100 and the upper side 201 of the second molded body 200.

The sacrificial layer 300 comprises a material suitable for the structuring described hereinafter based on FIG. 4. For example, the sacrificial layer 300 may comprise a photoresist. The sacrificial layer 300 may, for example, be applied to the upper side 201 of the second molded body 200 and the upper side 101 of the optoelectronic component part 100 by spin coating and subsequent curing.

Figure 4:
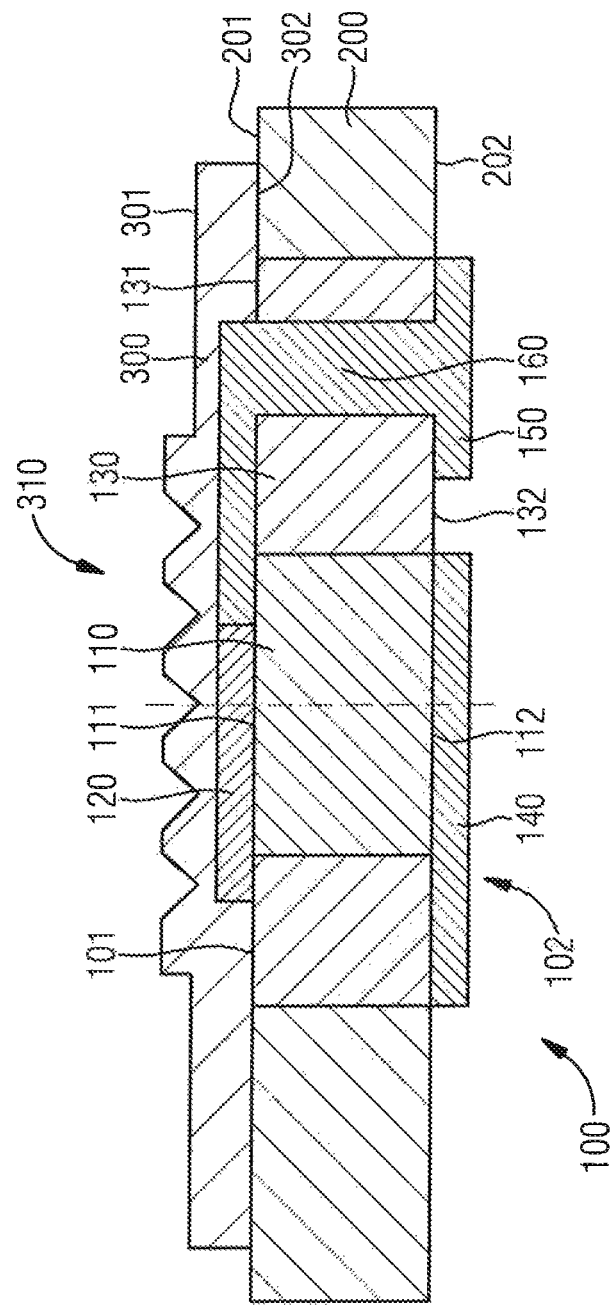
FIG. 4 schematically shows a cut-away side view of the molded body and the sacrificial layer after a structuring of the sacrificial layer.

FIG. 4 shows a schematic cut-away side view of the second molded body 200 including the optoelectronic component part 100 embedded therein, and the sacrificial layer 300 arranged above the second molded body 200 and the optoelectronic component part 100, in a processing state that chronologically follows the depiction of FIG. 3. The sacrificial layer 300 has been structured in a processing step carried out between the depictions of FIGS. 3 and 4. As a result, a structuring 310 of the sacrificial layer 300 has been created on the upper side 301 of the sacrificial layer 300. In addition, the sacrificial layer 300 has been partially removed so that sections of the upper side 201 of the second molded body 200 are no longer covered by the sacrificial layer 300, but are exposed.

The structuring 310 on the upper side 301 of the sacrificial layer 300 is arranged above the upper side 111 of the optoelectronic semiconductor chip 110 of the optoelectronic component part 100. The structuring 310 may, for example, be configured as a negative of an optically imaging lens structure, for example, as a negative of a Fresnel lens structure. However, the structuring 310 on the upper side 301 of the sacrificial layer 300 may also be omitted. In this case, the upper side 301 of the sacrificial layer 300 may be configured essentially flat, according to the processing carried out between the processing states depicted in FIGS. 3 and 4.

Structuring the sacrificial layer 300 may, for example, be carried out via a photolithographic method. In particular, structuring the sacrificial layer 300 may be carried out, for example, via mask, contact, grayscale, or laser-interference lithography. However, structuring the sacrificial layer 300 may alternatively also be carried out via direct illumination, for example, by a laser beam, or via an imprinting method.

Figure 5:
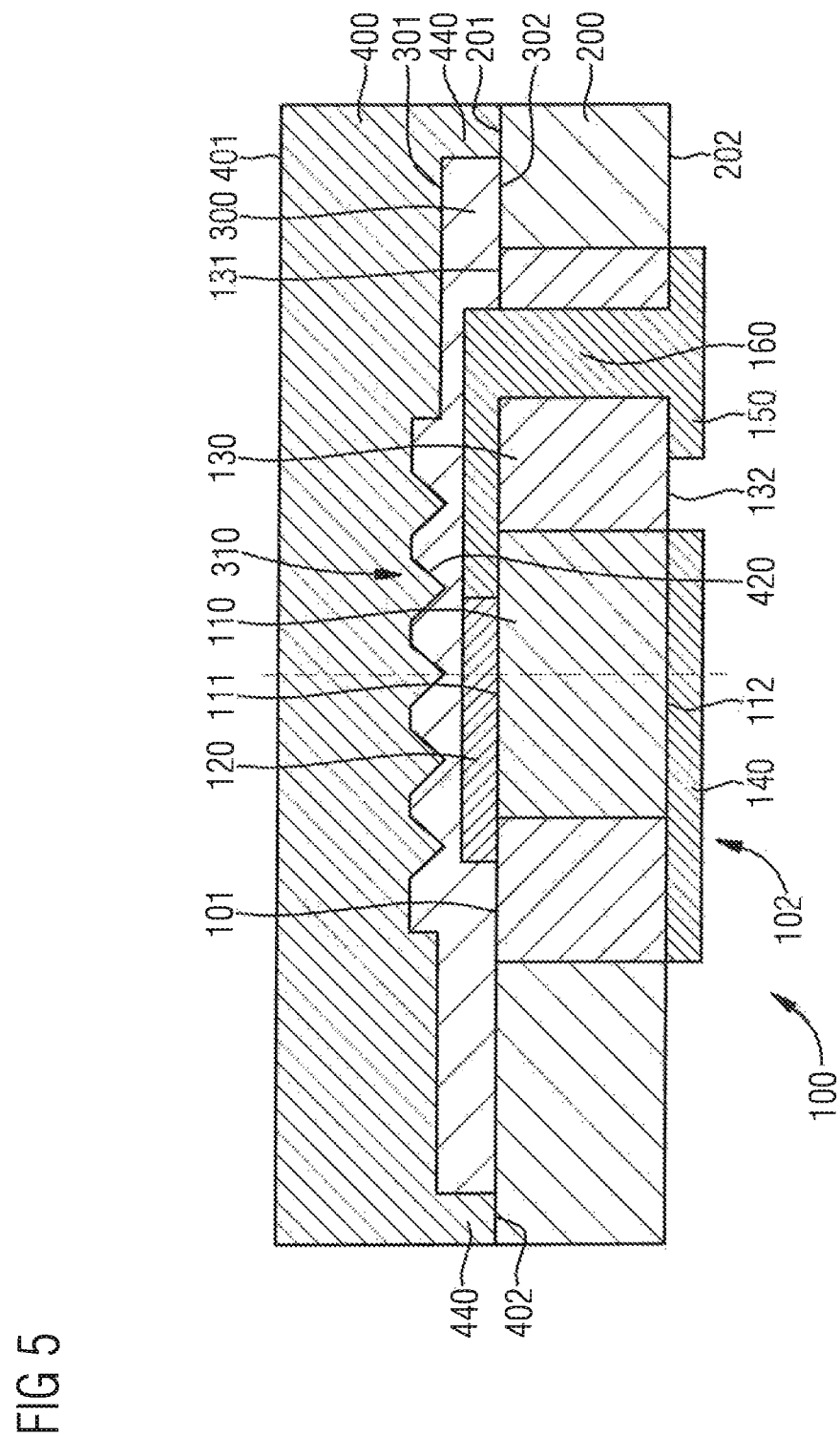
FIG. 5 schematically shows a cut-away side view of the molded body, the sacrificial layer, and a layer of an optical material arranged above it.

FIG. 5 shows a schematic cut-away side view of the second molded body 200, the optoelectronic component part 100, and the sacrificial layer 300, in a processing state that chronologically follows the depiction of FIG. 4. A layer of an optical material 400 has been arranged above the upper side 301 of the sacrificial layer 300. The layer of the optical material 400 has an upper side 401 and a lower side 402 opposite the upper side 401. The lower side 402 of the layer of the optical material 400 contacts the upper side 301 of the sacrificial layer 300. In the areas of the upper side 201 of the second molded body 200 which have been exposed during the structuring of the sacrificial layer 300 by removing the sacrificial layer 300, the lower side 402 of the layer of the optical material 400 is also in direct contact with the upper side 201 of the second molded body 200, and there forms anchors 440 of the layer of the optical material 400.

In the area of the structuring 310 on the upper side 301 of the sacrificial layer 300, the lower side 402 of the layer of the optical material 400 has a lower-side structuring 420 that forms a negative of the structuring 310 on the upper side 301 of the sacrificial layer 300. If the structuring 310 on the upper side 301 of the sacrificial layer 300 is configured as a negative of a Fresnel lens structure, the lower side of the structuring 420 of the layer of the optical material 400 accordingly forms a positive of a Fresnel lens structure.

The layer of the optical material 400 comprises an optically transparent material, preferably an optically transparent plastic. For example, the layer of the optical material 400 may include a silicone or a polycarbonate.

Figure 6:
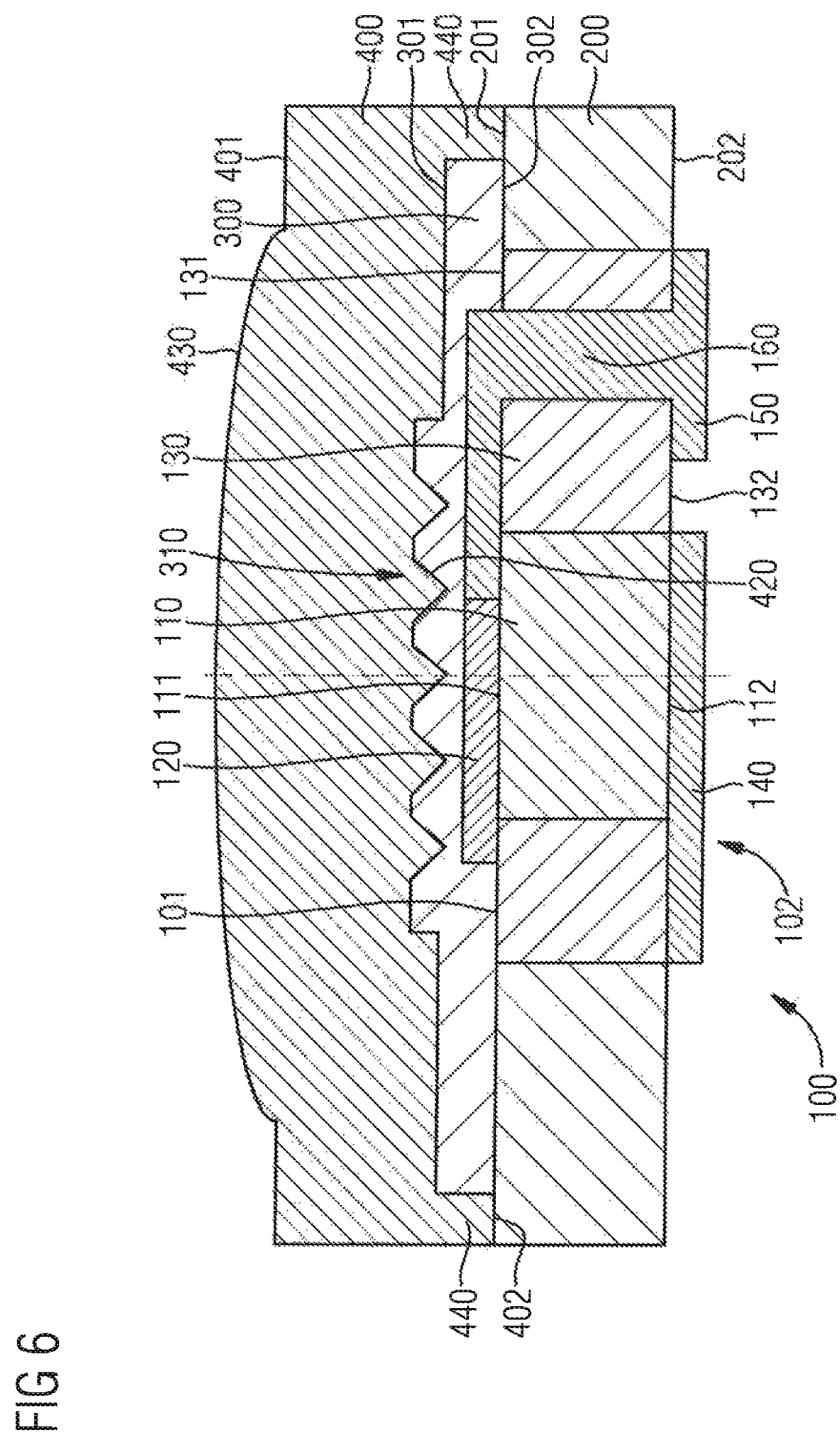
FIG. 6 schematically shows a cut-away side view of the molded body, the sacrificial layer, and the layer of the optical material after a structuring of the optical material.

FIG. 6 shows a schematic cut-away side view of the optoelectronic component part 100, the second molded body 200, the sacrificial layer 300, and the layer of the optical material 400, in a processing state that chronologically follows the depiction of FIG. 5. The layer of the optical material 400 has been structured in a processing step carried out between the processing states depicted in FIGS. 5 and 6. In this case, an upper-side structuring 430 has been created on the upper side 401 of the layer of the optical material 400.

The upper-side structuring 430 is arranged above the upper side 101 of the optoelectronic component part 100, in particular above the upper side 111 of the optoelectronic semiconductor chip 110. The upper-side structuring 430 may, for example, be configured as a convex lens structure or as an Argus lens structure. However, the upper-side structuring 430 may also be configured as another lens structure.

Structuring the layer of the optical material 400 may, for example, be carried out via a photolithographic method or via an imprinting method.

Figure 7:
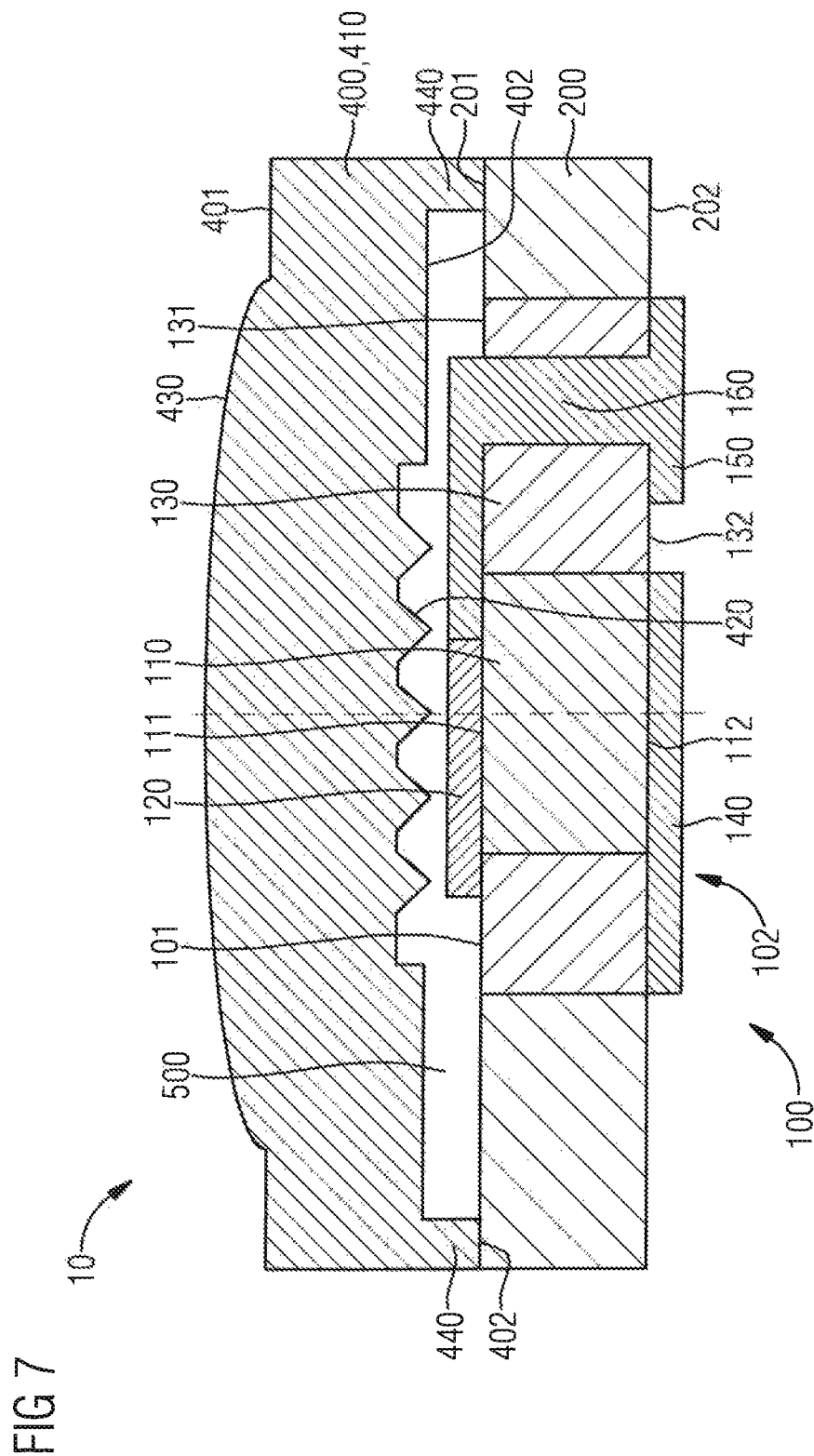
FIG. 7 schematically shows a cut-away side view of an optoelectronic component according to a first example.

FIG. 7 shows a schematic cut-away side view of the optoelectronic component part 100, the second molded body 200, and the layer of the optical material 400, in a processing state that chronologically follows the depiction of FIG. 6.

The sacrificial layer 300 has been removed from the area between the lower side 402 of the layer of the optical material 400 and the upper side 101 of the optoelectronic component part 100 as well as the upper side 201 of the second molded body 200. As a result, an optical lens 410 has been formed from the layer of the optical material 400. The second molded body 200 including the embedded optoelectronic component part 100 and the optical lens 410 together form an optoelectronic component 10.

Removal of the sacrificial layer 300 may preferably be carried out by dissolving the sacrificial layer 300. For example, the sacrificial layer 300 may be dissolved by a solvent or an etching solution. In this case, the solvent or the etching solution may penetrate through openings provided in the layer of the optical material 400 to the sacrificial layer 300. These openings may, for example, be created during structuring the layer of the optical material 400. Alternatively, the sacrificial layer 300 may be configured and structured such that the openings are formed during the creation of the layer of the optical material 400. Another option is to form openings providing an access to the sacrificial layer 300 during a subsequent, more precisely defined dicing of the second molded body 200 and the layer of the optical material 400.

By removing the sacrificial layer 300, an air gap 500 is formed between the upper side 101 of the optoelectronic component part 100 and the lower side 402 of the optical lens 410 formed from the layer of the optical material 400 having the lower-side structuring 420. The lower side 402 of the optical lens 410 is thus arranged above the upper side 101 of the optoelectronic component part 100, but is spaced apart from the upper side 101 of the optoelectronic component part 100 by the air gap 500. The optical lens 410 is anchored to the second molded body 200 via the anchors 440.

During operation of the optoelectronic component 10, the optoelectronic component part 100 emits electromagnetic radiation on its upper side 101, which is at least partially converted into electromagnetic radiation of a different wavelength via the converter element 120, which is optionally present. The optical lens 410 produces beam shaping of the electromagnetic radiation and projects it into a target area in the vicinity of the optoelectronic component 10. Thus, the electromagnetic radiation is deflected both at the interface between the air gap 500 and the lower side 402 of the optical lens 410, and at the interface between the upper side 401 of the optical lens 410 and the vicinity of the optoelectronic component 10. Thus, both the lower-side structuring 420 on the lower side 402 of the optical lens 410 and the upper-side structuring 430 on the upper side 401 of the optical lens 410 produce beam shaping.

The electrical contacts 140, 150, which are accessible on the lower side 102 of the optoelectronic component part 100 embedded into the second molded body 200, form electrical connection surfaces of the optoelectronic component 10. The optoelectronic component 10 may, for example, be provided as an SMT component for surface mounting, for example, for surface mounting by reflow soldering.

The optoelectronic component 10 may be produced together with a plurality of other optoelectronic components 10 in common processing steps. For this purpose, multiple optoelectronic component parts 100 are embedded together into the second molded body 200 in an arrangement spaced apart from one another.

A section of the sacrificial layer 300 is then arranged above each optoelectronic component part 100 embedded into the second molded body 200 and structured in the described manner. For example, the sacrificial layer 300 may be arranged as a connected layer above all optoelectronic component parts 100 embedded into the second molded body 200. If the structuring of the sections of the sacrificial layer 300 is carried out via direct illumination by a laser, the positions of the individual optoelectronic component parts 100 embedded into the second molded body 200 may thus be initially detected in a preceding processing step. As a result, the structurings 310 of the sacrificial layer 300 may be exactly oriented toward the optoelectronic semiconductor chips 110 of the optoelectronic component parts 100.

In a subsequent processing step, a section of the layer of the optical material 400 is arranged above each section of the sacrificial layer 300 and structured in the described manner.

Subsequently, the second molded body 200 and the layer of the optical material 400 are diced to singulate the optoelectronic components 10. Dicing the molded body 200 and the layer of the optical material 400 may be carried out before or after removal of the sacrificial layer 300.

If the optoelectronic component parts 100 are embedded into the second molded body 200 in a regular two-dimensional matrix arrangement, the second molded body 200 may, for example, initially be diced into rows or into columns, whereby accesses to the sections of the sacrificial layer 300 are created. After the subsequent removal of the sections of the sacrificial layer 300, the columns or rows of the second molded body 200 and the layer of the optical material 400 are further diced to definitively singulate the optoelectronic components 10.

Figure 8:
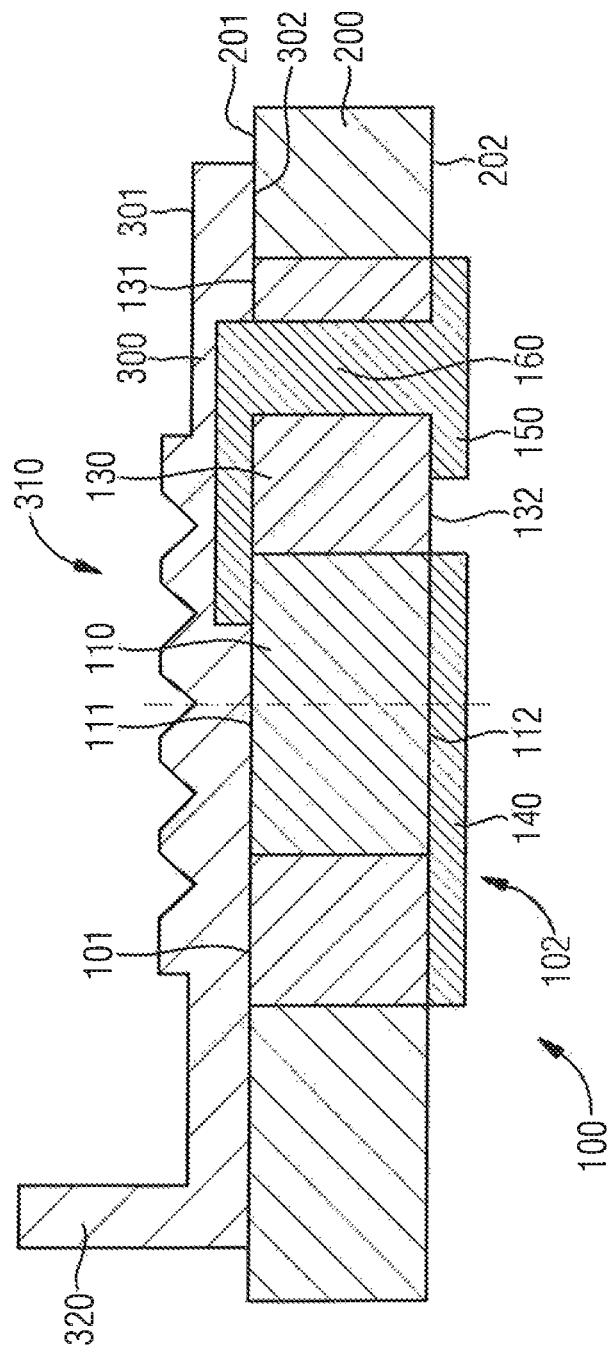
FIG. 8 schematically shows a cut-away side view of the molded body and the structured sacrificial layer according to an alternative example of the method.
Figure 9:
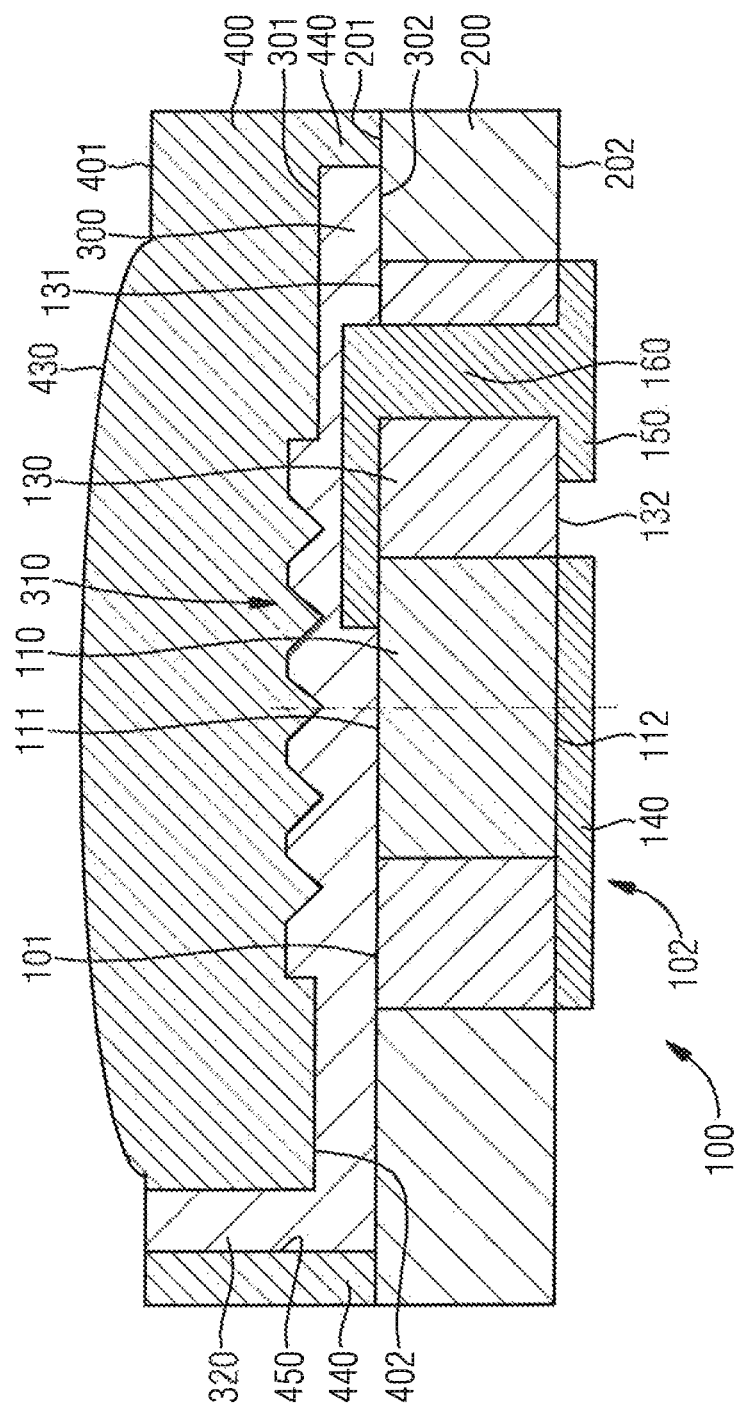
FIG. 9 schematically shows a cut-away side view of the molded body, the sacrificial layer, and the structured layer of the optical material in this example.
Figure 10:
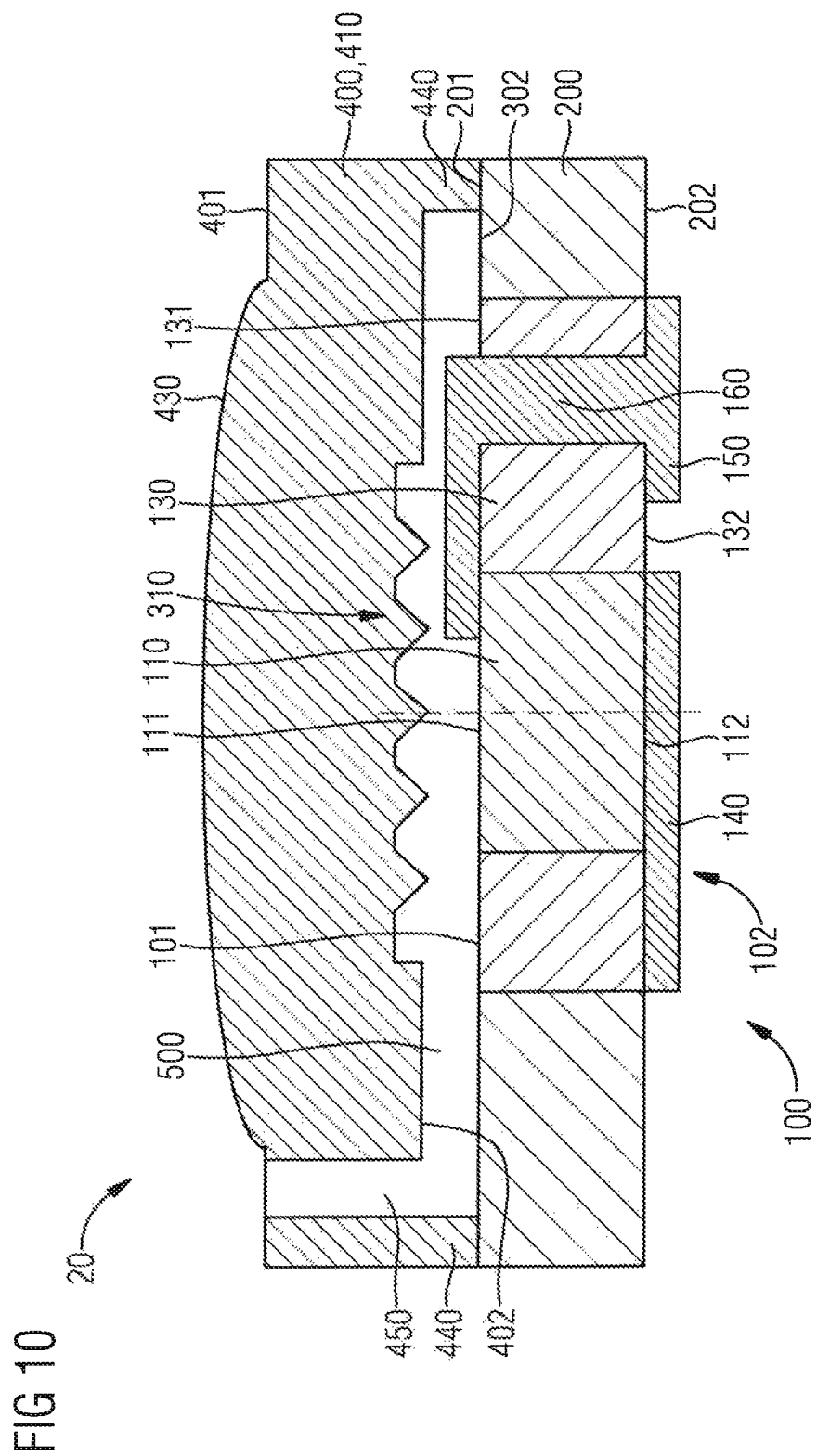
FIG. 10 schematically shows a cut-away side view of an optoelectronic component according to a second example.

A method of producing an optoelectronic component 20 according to an alternative example will be described below, based on FIGS. 8 to 10. The optoelectronic component 20 and the method for its production are highly similar to the optoelectronic component 10 of FIG. 7 and the method for its production described based on FIGS. 1 to 7. In FIGS. 8 to 10, corresponding components are therefore provided with the same reference numerals as in FIGS. 1 to 7. The following description focuses on a demonstration of the differences between the optoelectronic component 20 of the second example and the optoelectronic component 10 of the first example, and the differences between the respective production methods.

FIG. 8 shows a schematic cut-away side view of the second molded body 200 with the optoelectronic component part 100 embedded therein, and the structured sacrificial layer 300 arranged above the upper sides 101, 201 of the optoelectronic component part 100 and the second molded body 200, in a processing state corresponding to the processing state shown in FIG. 4. The processing state shown in FIG. 8 is obtainable in that the processing steps described based on FIGS. 1 to 4 are carried out in a similar manner.

The optoelectronic component part 100 shown in FIG. 8 differs from the optoelectronic component part 100 depicted in FIG. 4 due to the absence of the converter element 120. However, it would also be possible to provide the converter element 120 in the case of the optoelectronic component part 100 in the example of FIG. 8.

The structured sacrificial layer 300 in the depiction of FIG. 8 differs from the sacrificial layer 300 in depiction of FIG. 4 in that it has an additional placeholder 320 extending upwardly in a columnar manner from the upper side 201 of the second molded body 200 in a direction perpendicular to the upper side 201 of the second molded body 200. During structuring of the sacrificial layer 300, the placeholder 320 has been created in that the sacrificial layer 300 has not been removed in the area of the placeholder 320.

FIG. 9 shows a schematic cut-away side view of the second molded body 200 including the embedded optoelectronic component part 100 and including the sacrificial layer 300 arranged above the second molded body 200 and the optoelectronic component part 100, in a processing state that chronologically follows the depiction of FIG. 8. In processing steps carried out between the depictions of FIGS. 8 and 9, the layer of the optical material 400 has been arranged and structured above the upper side 301 of the sacrificial layer 300. The processing state depicted in FIG. 9 thus corresponds to the processing state depicted in FIG. 6.

The structured layer of the optical material 400 in the situation depicted in FIG. 9 differs from the situation depicted in FIG. 6 in that the placeholder 320 of the sacrificial layer 300 extends from the lower side 402 of the layer of the optical material 400, through the entire layer of the optical material 400, to the upper side 401 of the layer of the optical material 400. As a result, a channel 450 extending through the layer of the optical material 400 is formed, in which the placeholder 320 of the sacrificial layer 300 is arranged. The channel 450 establishes a connection from the upper side 401 of the layer of the optical material 400 to the sacrificial layer 300.

FIG. 10 shows a schematic cut-away side view of the optoelectronic component part 100, the second molded body 200, and the layer of the optical material 400, in a processing state that chronologically follows the depiction of FIG. 9. The processing state depicted in FIG. 10 corresponds to the processing state depicted in FIG. 7. In a processing step carried out between the processing states depicted in FIGS. 9 and 10, the sacrificial layer 300 has been removed. As a result, the second optoelectronic component 20 has been formed.

The removal of the sacrificial layer 300 has been carried out by dissolving the sacrificial layer 300 by an etching solution or a solvent. In this case, the etching solution or the solvent has penetrated through the channel 450 in the layer of the optical material 400, to the sacrificial layer 300.

FIG. 11 shows a schematic cut-away side view of an optoelectronic component 30 according to a third example. The optoelectronic component 30 is highly similar to the optoelectronic component 10 of the first example. In FIG. 11, corresponding components are therefore provided with the same reference numerals as in FIG. 7. The optoelectronic component 30 may be produced via the method described based on FIGS. 1 to 7, wherein the deviations and particular features described below are to be taken into account.

The optoelectronic component 30 differs from the optoelectronic component 10 due to the presence of a microsystems technology actuator 600, which is configured to move the optical lens 410 relative to the second molded body 200 of the optoelectronic component 30.

In the schematically depicted example, the actuator 600 is configured as an electrostatic actuator. The actuator 600 has lens-side electrodes 610 arranged in the area of the air gap 500 on the lower side 402 of the optical lens 410. In addition, the actuator 600 has molded body-side electrodes 620 arranged in the area of the air gap 500 on the upper side 201 of the second molded body 200 and opposite the lens-side electrodes 610. By applying a voltage between the lens-side electrodes 610 and the molded body-side electrodes 620, a force acting between the lens-side electrodes 610 and the molded body-side electrodes 620 may be generated, which moves the optical lens 410 of the optoelectronic component 30 relative to the second molded body 200 in a direction perpendicular to the upper side 201 of the second molded body 200, and thus also relative to the optoelectronic component part 100 and the optoelectronic semiconductor chip 110.

If the lens-side electrodes 610 are laterally displaced relative to the molded body-side electrodes 620, a force acting between the lens-side electrodes 610 and the molded body-side electrodes 620 of the actuator 600 may also effect a deflection of the optical lens 410 in a direction parallel to the upper side 201 of the second molded body 200.

In a processing state chronologically following the depiction of FIG. 2, the molded body-side electrodes 620 may, for example, be applied to the upper side 201 of the second molded body 200 before the sacrificial layer 300 is subsequently arranged on the upper side 201 of the second molded body 200. In a processing step chronologically following the depiction of FIG. 4, the lens-side electrodes 610 may, for example, be applied to the upper side 301 of the structured sacrificial layer 300 before the layer of the optical material 400 is subsequently arranged above the upper side 301 of the sacrificial layer 300. After removing the sacrificial layer 300, the lens-side electrodes 610 then remain on the lower side 402 of the optical lens 410 formed from the layer of the optical material 400.

The movement of the optical lens 410 of the optoelectronic component 30 relative to the optoelectronic semiconductor chip 110 of the optoelectronic component 30, which is made possible by the actuator 600, enables a dynamic adjustment of the optical imaging properties of the optoelectronic component 30 during the operation of the optoelectronic component 30. This may, for example, be used to generate changing images or a variable flashing light.

Our methods and structures are illustrated and described in greater detail based on the preferred examples. However, this disclosure is not limited to the described examples. Rather, other variations may be derived from them by those skilled in the art, without departing from the scope of protection of the appended claims.

This application claims priority of DE 10 2014 116 134.3, the subject matter of which is herein incorporated by reference.

The invention claimed is:

1. A method of producing an optoelectronic component comprising:
   embedding an optoelectronic component part into a molded body such that an upper side of the optoelectronic component part is at least partially exposed on an upper side of the molded body;
   arranging and structuring a sacrificial layer above the upper side of the optoelectronic component part and the upper side of the molded body;
   arranging and structuring a layer of an optical material above the sacrificial layer; and
   removing the sacrificial layer.

2. The method as claimed in claim 1, wherein the optoelectronic component part comprises an optoelectronic semiconductor chip or a light-emitting diode chip.

3. The method as claimed in claim 1, wherein the optoelectronic component part is embedded into the molded body such that a lower side of the optoelectronic component part is at least partially exposed on a lower side of the molded body.

4. The method as claimed in claim 3, wherein the optoelectronic component part has electrical contacts on its lower side.

5. The method as claimed in claim 3, wherein embedding the optoelectronic component part into the molded body is carried out such that the upper side and the lower side of the optoelectronic component part are flush with the upper side and the lower side of the molded body.

6. The method as claimed in claim 1, wherein the molded body is formed by a molding method, and
the optoelectronic component part is embedded into the molded body during formation of the molded body.

7. The method as claimed in claim 1, wherein the sacrificial layer comprises a photoresist.

8. The method as claimed in claim 1, wherein structuring the sacrificial layer is carried out via a photolithographic method via mask, contact, grayscale, or laser-interference lithography, via direct illumination, or via an imprinting method.

9. The method as claimed in claim 1, wherein removal of the sacrificial layer is carried out by dissolving the sacrificial layer.

10. The method as claimed in claim 9, wherein dissolving the sacrificial layer is carried out by a solvent or an etching solution.

11. The method as claimed in claim 1, wherein the optical material comprises a plastic.

12. The method as claimed in claim 1, wherein structuring the optical material is carried out via a photolithographic method or an imprinting method.

13. The method as claimed in claim 1, wherein multiple optoelectronic component parts are embedded together into the molded body,
a section of the sacrificial layer is arranged and structured above each optoelectronic component part,
a section of the optical material is arranged and structured above each section of the sacrificial layer, and
the optoelectronic component is singulated by dicing the molded body.

14. The method as claimed in claim 13, wherein dicing the molded body is carried out before removal of the sacrificial layer or after removal of the sacrificial layer.

* * * * *